(12) United States Patent
Stoltenberg et al.

(10) Patent No.: US 10,919,281 B2
(45) Date of Patent: Feb. 16, 2021

(54) NANOPARTICLE APPLICATION WITH ADHESIVES FOR PRINTABLE ELECTRONICS

(71) Applicant: LOCKHEED MARTIN CORPORATION, Bethesda, MD (US)

(72) Inventors: Randall Mark Stoltenberg, Palo Alto, CA (US); Alfred A. Zinn, Palo Alto, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 311 days.

(21) Appl. No.: 15/462,681

(22) Filed: Mar. 17, 2017

(65) Prior Publication Data

US 2018/0270962 A1    Sep. 20, 2018

(51) Int. Cl.
| | | |
|---|---|---|
| *B32B 37/06* | (2006.01) | |
| *B32B 7/12* | (2006.01) | |
| *H05K 3/38* | (2006.01) | |
| *H05K 3/12* | (2006.01) | |
| *H05K 1/09* | (2006.01) | |
| *H05K 1/03* | (2006.01) | |

(52) U.S. Cl.
CPC .............. *B32B 37/06* (2013.01); *B32B 7/12* (2013.01); *H05K 1/097* (2013.01); *H05K 3/1208* (2013.01); *H05K 3/386* (2013.01); B32B 2307/202 (2013.01); B32B 2309/105 (2013.01); B32B 2457/08 (2013.01); H05K 1/0393 (2013.01); H05K 2203/0126 (2013.01); H05K 2203/1366 (2013.01)

(58) Field of Classification Search
CPC ......... B32B 37/06; B32B 3/0076; B32B 7/05; B32B 7/12; H05K 1/00; H05K 3/12
USPC ........................................... 428/323
See application file for complete search history.

(56) References Cited

U.S. PATENT DOCUMENTS

| | | | | |
|---|---|---|---|---|
| 5,136,365 A | * | 8/1992 | Pennisi ................ | H01L 21/563 148/24 |
| 6,042,894 A | * | 3/2000 | Goto ...................... | C09J 9/02 427/504 |
| 2002/0027294 A1 | * | 3/2002 | Neuhaus ........... | G06K 19/07752 257/778 |
| 2004/0087128 A1 | * | 5/2004 | Neuhaus ............... | H01B 1/16 438/610 |
| 2006/0163744 A1 | * | 7/2006 | Vanheusden .......... | B82Y 30/00 257/773 |
| 2009/0099283 A1 | * | 4/2009 | Ishihara ................ | C08G 18/12 524/107 |
| 2010/0098937 A1 | * | 4/2010 | Fujii ....................... | B32B 5/16 428/328 |

(Continued)

*Primary Examiner* — Jane L Stanley
(74) *Attorney, Agent, or Firm* — Morgan, Lewis & Bockius LLP

(57) ABSTRACT

A circuit assembly can be made by adhering a conductive element to a substrate with an adhesive. A first layer including an adhesive can be applied over at least a portion of a surface of the substrate. A second layer including a conductive metal can be applied over at least a portion of the first layer. The first layer and the second layer can be exposed to a temperature for a duration of time to (1) fuse the conductive metal together in at least a portion of the first layer and (2) cure the adhesive of the second layer. The fusing can be substantially complete before the curing is substantially complete to enhance bonding of the adhesive to the fused conductive metal.

8 Claims, 5 Drawing Sheets

(56) References Cited

U.S. PATENT DOCUMENTS

2016/0128201 A1* 5/2016 Ciufo .................. H05K 3/4069
                                                                                    29/852
2016/0179253 A1* 6/2016 Franklin ............... G06F 1/1626
                                                                                   345/174

* cited by examiner

NANOPARTICLE APPLICATION WITH ADHESIVES FOR PRINTABLE ELECTRONICS

STATEMENT REGARDING FEDERALLY SPONSORED RESEARCH OR DEVELOPMENT

Not Applicable.

BACKGROUND

Field

The present disclosure relates to printed electronics and, in particular, the creation of circuit elements using adhesives.

Description of the Related Art

Electrical assemblies are currently fabricated using a rigid substrate with individual components attached to the substrate and interconnected with conductive paths or "traces" on the substrate. The traces are typically created on the surface of the substrate by coating the entire surface of the substrate with a layer of copper, masking the copper with the interconnect pattern using a photolithographic process, and selectively etching away the non-masked copper. The minimum separation of the traces is often limited by the etching process. More complicated circuits are fabricated using multiple layers of circuit traces separated by insulating layers with connections between the conductive layers formed by holes between the insulating layers that are filled with conductive material. These interlayer connections are called "vias." A rigid substrate with one or more layers of circuit traces is referred to as a printed circuit board ("PCB") and an electronic assembly that is formed by mounting electronic components to the PCB is a printed circuit board assembly ("PCBA").

The drive to fit electronics into smaller or curved packages drove the development of flexible substrates where the traces are created by plating and etching as done with the rigid substrates or screen printing a conductive material onto the flexible substrate. These flexible printed circuits ("FPCs") are limited in the separation of circuit elements, referred to as the "pitch" of the traces, in the same way as convention rigid PCB fabrication as they use the same processes to form the circuits.

The ability to directly print circuit elements has been developed to take advantage of low-cost printing technologies. Common printing processes such as screen printing, gravure, offset lithography, and inkjet have been used to create circuits using both conductive carbon-based compounds and metals. Each of the processes has advantages and disadvantages related to resolution, throughput, and cost. Circuits fabricated from carbon-based compounds have a lower conductivity than metal circuits. The metal inks require temperatures of up to 300° C. and durations of 30-60 min to fuse the metal particles into a continuous metal strips with sufficient electrical conductivity.

SUMMARY

The present disclosure relates to the printing of electronic circuits and elements using adhesive layers and nanoparticles, which enables the creation of circuits and elements onto a variety of rigid and flexible substrates.

A method of forming a conductive element on a substrate can include: applying a first layer first layer comprising an adhesive over at least a portion of a surface of a substrate; applying a second layer comprising particles of a conductive metal over at least a portion of the first layer; and exposing the first layer and the second layer to a temperature for a duration of time to (1) fuse the particles of the conductive metal together in at least a portion of the first layer and (2) cure the adhesive of the second layer, wherein the fusing is substantially complete before the curing is substantially complete.

A circuit assembly can include: a substrate; a first layer comprising a cured adhesive; and a second layer comprising fused nanoparticles of a conductive metal, wherein the first layer and the second layer have an interface there between in which the cured adhesive and the fused nanoparticles are mixed.

A circuit-printing device can include: a first printing head configured to emit a first layer onto a substrate, the first layer comprising an adhesive; and a second printing head programmed to emit a second layer onto the first layer before the first layer has cured, the second layer comprising particles of a conductive metal.

A system can include: a circuit-printing device as described above and a light or heat emitting device for fusing the particles of the conductive metal and curing the adhesive.

The second layer can further include a curing agent configured to catalyze curing of the adhesive. The curing agent can include amines. The conductive metal can include copper or silver. The adhesive can include epoxy. The adhesive can be nonconductive. The adhesive can have an electrical polarity that is greater than an electrical polarity of the particles of the conductive metal. The temperature can be no more than 200° C. The adhesive can have a curing profile and the nanoparticles of the conductive metal can have a fusing profile such that, when exposed to a temperature for a duration of time, the nanoparticles of the conductive metal substantially completely fuse before the adhesive substantially completely cures. The thickness of the second layer can be greater than a thickness of the first layer. The exposing can include infiltrating the first layer with the conductive material. The exposing can include infiltrating the second layer with the adhesive. After the exposing, a third layer comprising an adhesive can be applied over at least a portion of a surface of the second layer, and a fourth layer comprising particles of a conductive metal can be applied over at least a portion of the second layer.

In the following description, specific embodiments are described to shown by way of illustration how the invention may be practiced. It is to be understood that other embodiments may be utilized and changes may be made without departing from the scope of the present invention.

DETAILED DESCRIPTION

Figure 1:
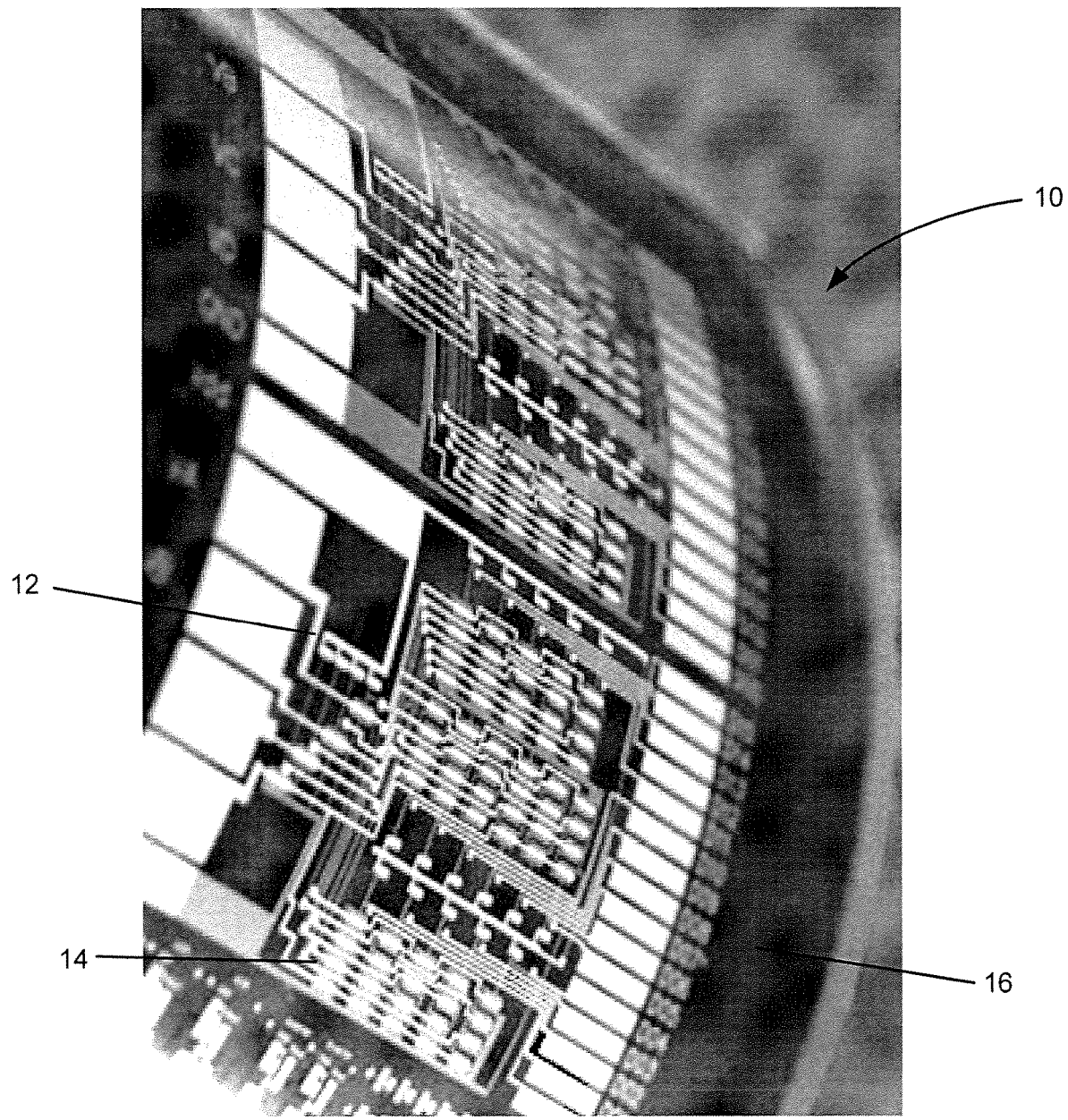
FIG. 1 illustrates a printed circuit assembly ("PCA") having a flexible substrate onto which electrical components and circuits have been printed, according to some embodiments of the present disclosure.

The field of printed flexible electronics offers new product concepts combined with low production cost, low energy consumption during manufacture, as well as the increased use of environmentally friendly materials and processes. The field has applications in wearable electronics, conformal and rapidly printable systems that can be designed and printed (3D printer/additive real-time manufacture) in the field for immediate threat response, as well as commercial space for complex broadband antenna designs and rapid low cost manufacture. Particularly attractive is the ability for rapid prototype turn-around optimization cycles to significantly shorten development time while greatly improving performance enabling highly optimized products. Currently, one prototype design, manufacture and test cycle takes weeks to months and can now be done in a few days.

Two key challenges have held back proliferation and wide-spread use of this technology. First, it is desired to provide a low-cost, highly conductive (i.e. close to bulk copper) copper-like material for printable traces, vias and interconnects that can be cured at low enough temperatures, e.g., around 200° C. in seconds to a few minutes without heating the substrate to its softening point/glass transition temperature. Second, it is desired to ensure good adhesion to a wide variety of desired flexible organic and inorganic substrates. Currently, most electronic materials, especially metals and ceramics, suffer from poor adhesion to such materials, greatly shortening product life and limiting application space.

To date, some manufacturers of conductive inks have improved adhesion by adding binders and adhesives directly to the paste or ink mixture. While this can provide better adhesion at the structure/substrate interface, the large amount required to achieve adhesion results in a high concentration of adhesive within the final fused/condensed structure itself, significantly reducing electrical and thermal performance by as much as several orders of magnitude and limits upper use temperatures due to the limited thermal stability of the polymer used. Others have tried to heat the substrate to the glass transition temperature thereof to melt the substrate to the printed structure. This method requires specific engineering of the substrate and therefore more expensive materials, and hence, is not a generally applicable method. In addition, it can lead to deformation of the substrate disrupting the overall design. Still others have grafted specialty polymers onto substrates using expensive plasma generating equipment. More recent efforts have focused on adding conductive polymers to the ink and paste formulations to provide an adhesive organic matrix. However, conductive polymers are still orders of magnitude lower in performance compared to metals. The nanomaterials typically used can be stabilized and protected from oxidation, for example, by carbon or PVP coating, or even a thin oxide layer, however, this markedly reduces their activity requiring relative high curing temperatures and long curing times as well as special chemical environments limiting applicability.

Embodiments of the present disclosure enable universal applicability nearly any substrate and provide both strong adhesion at the interface of printed metal structures and substrates as well as a flexible buffer layer that can accommodate large coefficient of thermal expansion ("CTE") mismatches and mechanical stresses during bending, thereby maximizing reliability and product lifetime. Because the adhesive need not be incorporated into the bulk of the structure, electrical and thermal performance can be maximized to near bulk material (e.g., copper) values. Also, the curative can be chosen such that any excess can evaporate during curing, leaving the printed metal structure free of additives that could impede performance.

The present disclosure relates to the creation of circuits and elements onto a variety of rigid and flexible substrates. FIG. 1 illustrates an example of a PCA 10 having a flexible substrate 16 onto which electrical components 14 and circuits 12 may be printed according to certain aspects of the present disclosure. Simple electrical circuits can be created on flexible substrates such as polyimide that are able to withstand the chemicals used to plate and etch the circuits and survive exposure to temperatures over 200° C. One advantage of flexible PCAs is that electronics built on the flexible PCAs may be packaged into small and irregularly shaped spaces. A flexible substrate also allows a PCA to conform to a curved support structure such that heat can be more effectively transferred to the structure. The difficulty in getting the heat out of electronics built on rigid printed circuit boards ("PCBs") limits the functionality of the electronics. Printing the circuits 12 and components 14 onto a substrate 16 using a process that does not require high temperature exposure opens up a variety of substrate materials that are otherwise excluded by the low-temperature limitation of the material.

Figure 2:
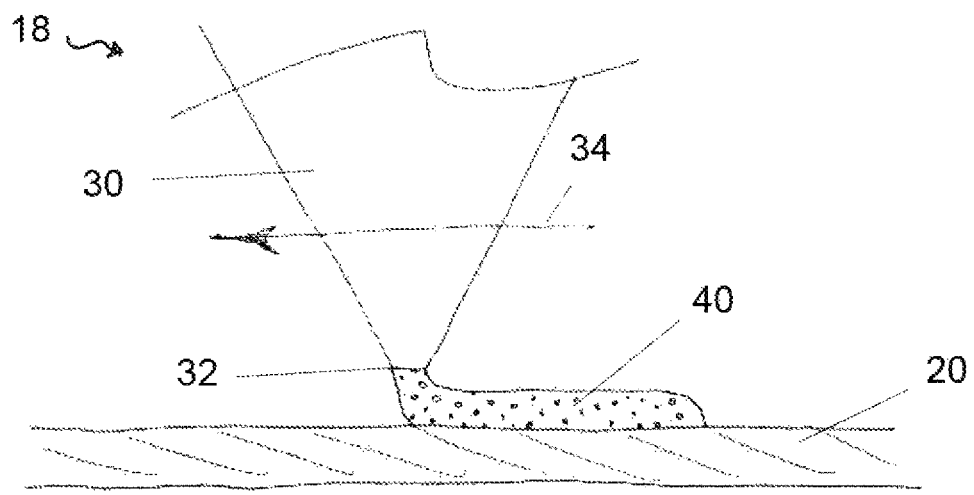
FIG. 2 illustrates a method of applying an adhesive layer to a substrate, according to some embodiments of the present disclosure.
Figure 3:
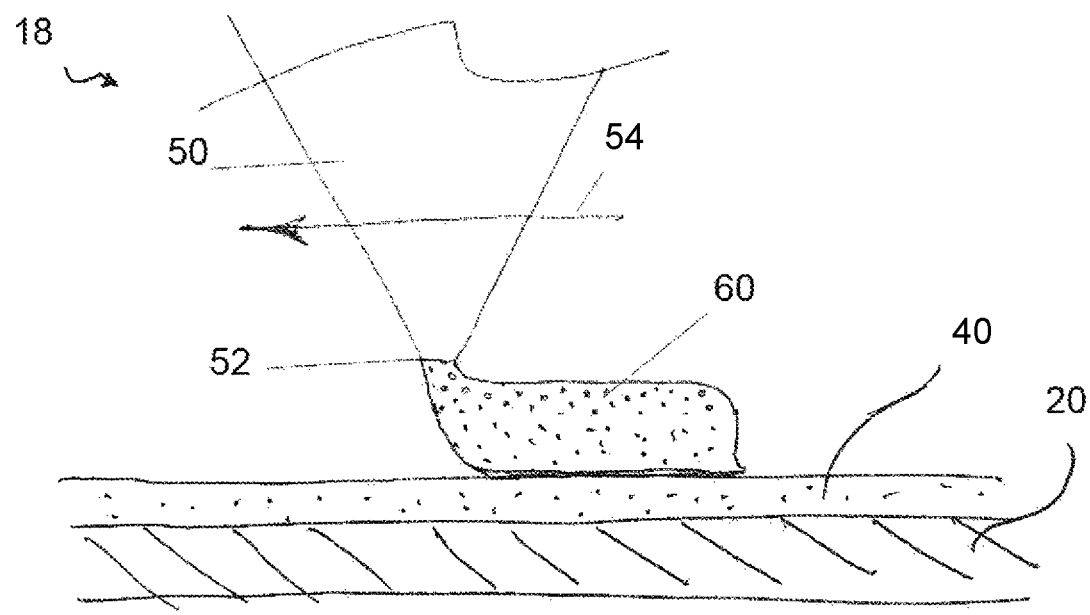
FIG. 3 illustrates a method of applying a conductive layer to the adhesive layer of FIG. 2, according to some embodiments of the present disclosure.

According to some embodiments, a circuit-printing device can be provided to form the PCA 10. FIGS. 2 and 3 illustrate an example of a circuit-printing device 18 that includes a first printing head 30 and a second printing head 50. The first printing head 30 is configured to emit a first layer or adhesive layer 40 onto a substrate 20. The adhesive layer 40 can include an adhesive that cures under certain conditions, as discussed further herein. FIG. 2 illustrates the adhesive layer 40 being sprayed or extruded from a nozzle 32 of the printing head 30 that is moving over the substrate 20, as indicated by the arrow 34 that indicates the direction of motion of the printing head 30. For example, the adhesive layer 40 can be sprayed with aerosol gas printing techniques. The diameter of the nozzle 32 can control the width and thickness of the pattern for the adhesive layer 40. Using a sheaf gas can further control the size of the droplet stream and with that tighter control of the printed features.

According to some embodiments, the second printing head 50 is configured to emit the second layer or conductive layer 60 onto the adhesive layer 40 and/or the substrate 20. The conductive layer 60 can include a conductive metal that fuses under certain conditions, as discussed further herein. For example, the conductive layer 60 can include particles (e.g., nanoparticles) of a conductive metal, such as copper or silver. The conductive layer 60 can further include a curing agent configured to catalyze curing of the adhesive layer 40. FIG. 3 illustrates the conductive layer 60 being sprayed or extruded from a nozzle 52 of the printing head 50 that is moving over the adhesive layer 40, as indicated by the arrow 54 that indicates the direction of motion of the printing head 50. For example, the conductive layer 60 can be sprayed with aerosol gas printing techniques. The diameter of the nozzle 52 can control the width and thickness of the pattern for the conductive layer 60. The particle concentration in the materials stream and the flow rate allow further control of the thickness and height of the printed structures. The conductive layer 60 is applied where it is intended to create a circuit element by fusing the conductive metal. The conductive layer 60 is applied in a pattern such as simple lines to form conductors or shapes.

Figure 4:
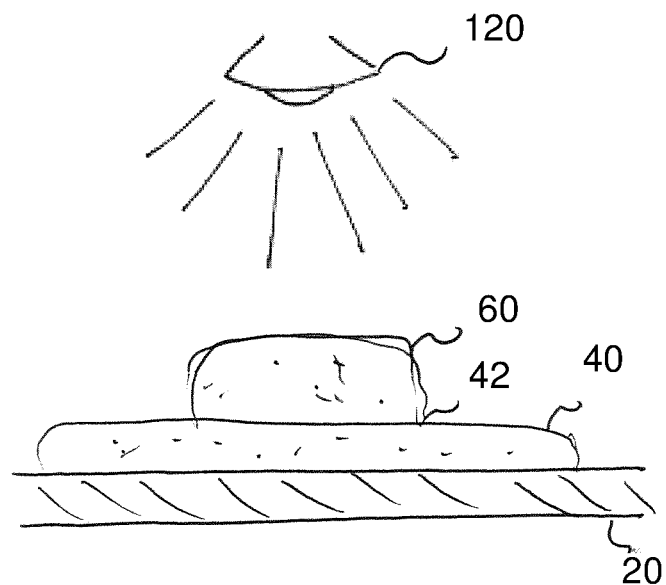
FIG. 4 illustrates a method of fusing a conductive layer and curing an adhesive layer, according to some embodiments of the present disclosure.
Figure 5:
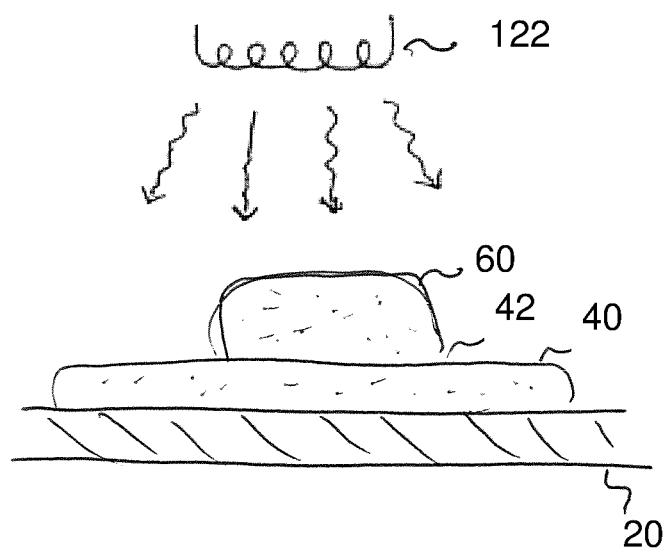
FIG. 5 illustrates a method of fusing a conductive layer and curing an adhesive layer, according to some embodiments of the present disclosure.

After the adhesive layer 40 and the conductive layer 60 have been formed on the substrate 20, the conductive layer 60 can be fused and the adhesive layer 40 can be cured by a process, such as illustrated in FIGS. 4 and 5. According to some embodiments, the adhesive layer 40 and the conductive layer 60 can be subjected to a thermal process, such as sintering, laser sintering, or photosintering, for a duration of time. The adhesive layer 40 can cure simultaneously with the conductive layer 60 during the process.

As illustrated in FIG. 4, the adhesive layer 40 and the conductive layer 60 can be exposed to a light source 120 that illuminates an area with sufficient energy that the conductive layer 60 fuses together and the adhesive layer 40 cures. The light source 120 can be energized at one or more power levels for various durations of time. The energy delivered by the light source 120 can be sufficient to fuse the conductive layer 60 and cure the adhesive layer 40 while raising the temperature of the substrate 20 to a temperature of less than a glass transition temperature of the substrate 20. The radiation emitted from the light source 120 can have a defined frequency band. The frequency band of the radiation emitted from the light source 120 can cover at least a portion of the adsorption band of the layers. According to some embodiments, the light source 120 can be a laser that is used to trace over a pattern to achieve fusing and/or curing. Similarly, an inscriber can be used to trace a pattern to achieve fusing and/or curing. The frequency range/substrate combination has to be chosen such that excessive absorption and heating of the substrate is avoided. At the same time, high absorption by the conductive material is desired for efficient heating and fusion in a short period of time.

As illustrated in FIG. 4, the adhesive layer 40 and the conductive layer 60 can be exposed to a heat source 122 that heats an area with sufficient energy that the conductive layer 60 fuses together and the adhesive layer 40 cures. The heat source 122 can be a radiant energy source. According to some embodiments, the heat source 122 can generate heat that is convectively conveyed to the substrate 20. The energy delivered by the heat source 122 can be sufficient to fuse the conductive layer 60 and cure the adhesive layer 40 while raising the temperature of the substrate 20 to a temperature of less than a glass transition temperature of the substrate 20.

According to some embodiments, a vapor-phase reflow process can be employed. As a vapor-phase process liquid is more effective in transferring thermal energy than the air in a convection oven, the temperature of the vapor can be limited to a lower temperature than the air of a convection oven while still achieving adequate processing speed. This lower temperature, in conjunction with the lower temperatures required to achieve fusing and curing, may enable fabrication using materials or components that are not suitable for higher-temperature processes.

According to some embodiments, a thermal process can be conducted until the conductive layer 60 is substantially completely fused. The conductive layer 60 can be considered to be substantially completely fused when the amount by volume that is fused together is greater than or equal to about 90%, 91%, 92%, 93%, 94%, 95%, 96%, 97%, 98%, 99%, or 100% of the entire conductive layer 60. According to some embodiments, a thermal process can be conducted until the adhesive layer 40 is substantially completely cured. The adhesive layer 40 can be considered to be substantially completely cured when the amount by volume that is fused together is greater than or equal to about 90%, 91%, 92%, 93%, 94%, 95%, 96%, 97%, 98%, 99%, or 100% of the entire adhesive layer 40. According to some embodiments, unfused portions of the conductive layer 60 and/or uncured portions of the adhesive layer 40 can be removed by a process, such as washing with an aqueous or non-aqueous liquid or other suitable means.

A thermal process can simultaneously fuse the conductive layer 60 and cure the adhesive layer 40. According to some embodiments, the duration of the thermal process can be about 1, 2, 3, 4, 5, 6, 7, 8, 9, or 10 minutes. According to some embodiments, the duration of the thermal process can be less than or about 1, 2, 3, 4, 5, 6, 7, 8, 9, or 10 seconds. According to some embodiments, the thermal process can maintain temperatures of the substrate 20, the adhesive layer 40, and the conductive layer 60 below about 200° C. For example, the temperature can be below or equal to about 70° C., 80° C., 90° C., 100° C., 110° C., 120° C., 130° C., 140° C., 150° C., 160° C., 170° C., 180° C., 190° C., 200° C., 210° C., 220° C., 230° C., or 240° C.

According to some embodiments, exposing the fusing of the conductive layer 60 can be substantially complete before the curing of the adhesive layer 40 is substantially complete. For example, the temperature and duration of the thermal process can be selected, along with aspects of the adhesive layer 40 and the conductive layer 60, such that the conductive layer 60 substantially completes fusing while the adhesive layer 40 remains at least somewhat uncured. This uniquely allows accommodating shrinkage in the conductive layer without cracking. This sequence allows the conductive layer 60 to fuse into a form that provides an interface 42 with the uncured portions of the adhesive layer 40. Accordingly, as the adhesive layer 40 then proceeds to cure, it can interact with the interface 42 to achieve a stronger bond. At the interface 42, the cured adhesive and the fused nanoparticles can be mixed to form a bond. According to some embodiments, the conductive layer 60 can substantially complete fusing at about the same time that the adhesive layer 40 substantially completes curing.

According to some embodiments, mixing or interdiffusion at the interface 42 can occur while the adhesive layer 40 is still soft and the metal layer is not fully fused or solidified. Mixing or interdiffusion can occur within a depth of about 1, 2, or 3 nm, thereby avoiding any a significant effect on electrical performance. Particles from the conductive layer 60 can migrate or penetrate into the adhesive layer 40 and establish a bond, for example, to amine functional groups present in the epoxy, poly urethane, and/or other polymers for a strong yet flexible bond. This provides an anchor to the conductive layer 60 above. In contrast, a fully cured polymer or substrate would not allow mixing, interdiffusion, migration, or penetration. Rather, interaction would be strictly at the surface with limited adhesive force. The conductive layer 60 can be somewhat porous and the adhesive layer 40 can penetrate into a first layer of pores for additional chemical and mechanical bonding further increasing adhesion between the two creating a rough interface 42.

According to some embodiments, the fusing and/or curing can be initiated prior to commencement of the thermal process. For example, pressure created by the spray or extrusion process can induce at least partial fusion within the conductive layer 60. By further example, the adhesive layer 40 can be partially cured at the time of application to the substrate 20. In such cases, the thermal process can complete and/or accelerate fusing and/or curing.

Figure 6:
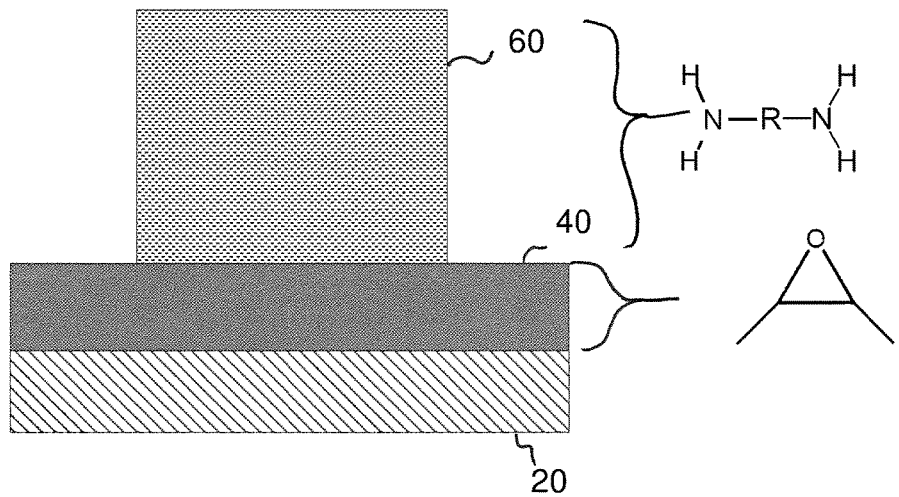
FIG. 6 illustrates an unfused conductive layer and an uncured adhesive layer on a substrate, according to some embodiments of the present disclosure.
Figure 7:
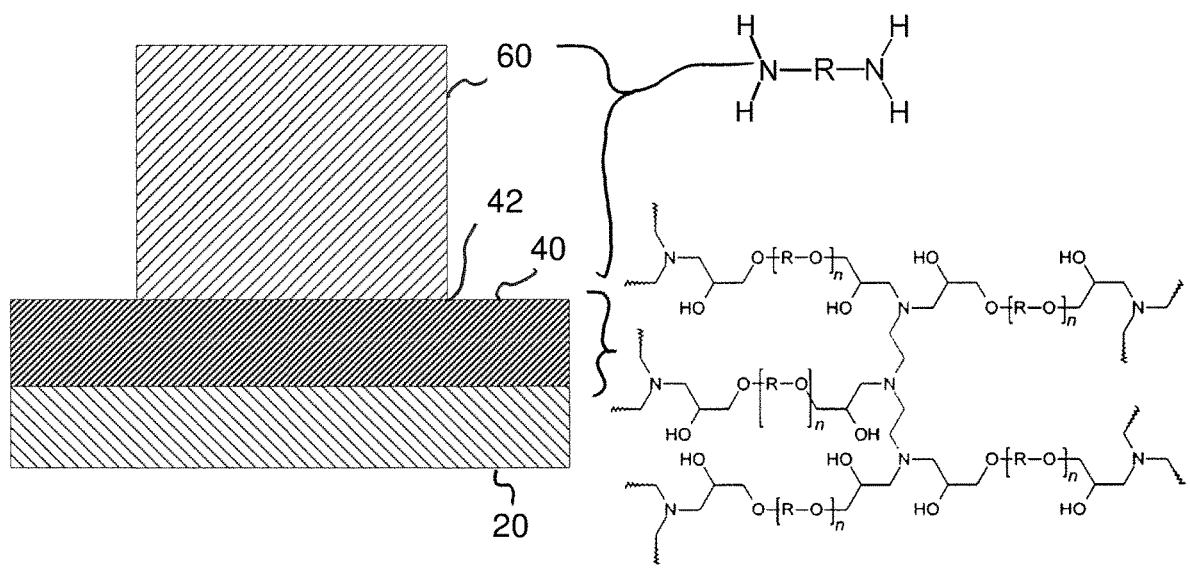
FIG. 7 illustrates a fused conductive layer and a cured adhesive layer on a substrate, according to some embodiments of the present disclosure.

FIGS. 6 and 7 illustrate properties of the adhesive layer 40 and the conductive layer 60. According to some embodiments, the adhesive layer 40 can include a resin and include, for example epoxies, urethanes, peptides, acrylates, silicones, or combinations thereof. The conductive layer 60 can include both a conductive metal and a curing agent, such as an activator that catalyzes curing of the adhesive layer 40. The curing agent can be less than 1% of the conductive layer 60 by weight or volume. The curing agent can include bases (e.g. amines), acids (organic or inorganic), and water. The curing agent can diffuse from the conductive layer 60 into the adhesive layer 40, triggering a polymerization process within the adhesive layer 40. The diffusion can occur before or during the thermal process. The thermal process can facilitate or accelerate reactions with the curing agent. Reactions between the curing agent and the adhesive layer 40 can include epoxidation or esterification, as illustrated in FIG. 7. For example, the curing agent can support polymerization of the adhesive resin through, for example, peptide formation from a mixture of simple aliphatic amines and organic acids, including diamine or diacid, such as ethylene diamine and oxalic acid. Through the thermal process, the curing agent can be entirely eliminated from the conductive layer 60, so that it does not interfere or impede the conductive properties of the fused conductive layer 60.

According to some embodiments, the adhesive layer 40 can include an adhesive that, when cured, adheres to the substrate 20 and the conductive layer 60 applied thereon. When cured, the adhesive layer 40 can be nonconductive, such that the conductive layer 60 is electrically isolated from the substrate 20. According to some embodiments, the conductive layer 60 does not include an adhesive, so that the undesirable reduction in electrical conductivity is avoided. This allows the use of metal substrates or graphitic substrate with high thermal conductivity to better remove heat for high power devices and systems.

According to some embodiments, elastomers or rubbers can function as a CTE buffer layer (not shown). An ability of the buffer layer to stretch can buffer movement of the substrate 20 relative to the trace during bending, thereby reducing mechanicals stresses otherwise imposed on the metal traces. The buffer layer can greatly increase durability, survivability, and reliability, ensuring long life.

According to some embodiments, aspects of the adhesive layer 40 and the conductive layer 60 can be selected to enhance interactions during the methods described herein. For example, dewetting at the interface 42 can be avoided by selecting materials with particular properties. According to some embodiments, the adhesive layer 40 can have a thickness that is substantially thinner than the thickness of the conductive layer 60. The thickness of the conductive layer 60 can be five times, ten times, or twenty times the thickness of the adhesive layer 40. The thickness of the adhesive layer 40 can be between 5 nm and 25 um, for example, between 100 nm and 1 um. The thickness of the conductive layer 60 can be between 50 nm and 500 um, for example, between 500 nm and 250 um. According to some embodiments, the adhesive layer 40 and the conductive layer 60 can have substantially similar hydrophobicity and/or hydrophilicity. According to some embodiments, the adhesive layer 40 or constituents thereof can have an electrical polarity that is greater than an electrical polarity of the conductive layer 60 or constituents thereof (e.g., conductive metal particles and/or curing agent). For example, one or more constituents of the adhesive layer 40 can be electrical polar, and one or more constituents of the conductive layer 60 can be electrical nonpolar.

Figure 8:
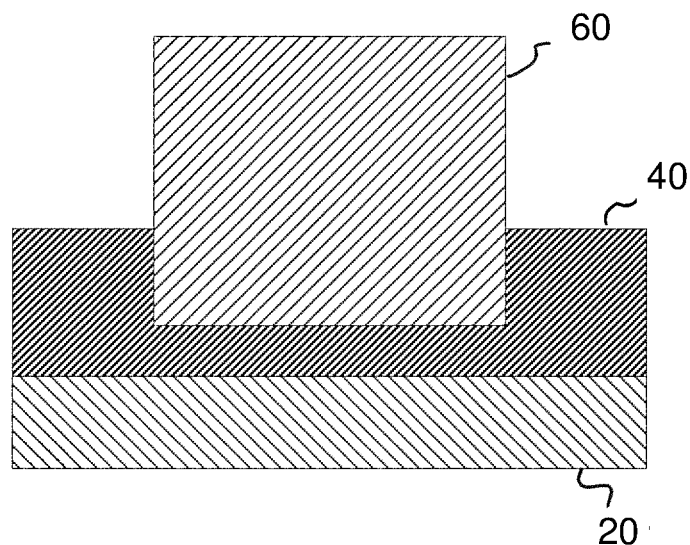
FIG. 8 illustrates a fused conductive layer and a cured adhesive layer on a substrate, according to some embodiments of the present disclosure.
Figure 9:
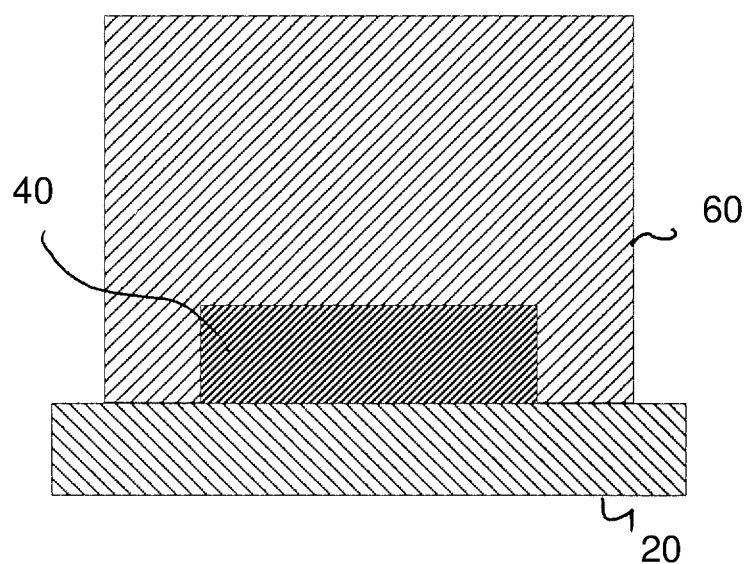
FIG. 9 illustrates a fused conductive layer and a cured adhesive layer on a substrate, according to some embodiments of the present disclosure.

The structures of the adhesive layer 40 and the conductive layer 60 can be modified according to desired outcomes. According to some embodiments, the width of the adhesive layer 40 and the conductive layer 60 can be similar, such that the adhesive layer 40 is confined to a very narrow area just underneath the conductive layer 60. According to some embodiments, as shown in FIG. 8, a width of the conductive layer 60 can be less than a width of the adhesive layer 40, such that edges of the adhesive layer 40 are exposed, and the conductive layer 60 is isolated from the substrate 20. According to some embodiments, as shown in FIG. 9, a width of the conductive layer 60 can be greater than a width of the adhesive layer 40, such that no portion of the adhesive layer 40 is exposed as it is surrounded by the conductive layer 60. The range of overlap can be, for example, within about 100 nm to 50 um. According to some embodiments, widths can be varied along the lengths of the adhesive layer 40 and the conductive layer 60, such that portions thereof have different widths at different locations.

According to some embodiments, the embodiments described herein allow printing conductive lines and/or traces on top of each other and safe crossovers. For example, a first conductive layer 60, adhered to a first adhesive layer 40, can be provided as a substrate for a second adhesive layer and a second conductive layer, which can be formed according to the description provided herein. The process can be repeated as desire for any number of layers. The thickness of the adhesive layer can be selected such that cross talk and capacitant interference is avoided. Accordingly, the occupation of space as multiple layers are formed is more compact than prior approaches, allowing more efficient use of a given space. Such a result is not easily possible with current technologies.

According to some embodiments, the embodiments described herein can be used to fully encapsulate conducive traces. For example, an insulative or protective layer can be provided between a conductive layer 60 and an external environment to protect against oxidation and/or corrosion.

According to some embodiments, the embodiments described herein can accommodate a wide range of other dimensions such as line width (unlimited), different aspect ratios (i.e., thin and tall, etc.), filling in trenches with conductive material, and/or cover or encapsulating the components.

According to some embodiments, the methods described herein can be used for placing and securing surface mount components. For example, an entire printed electronic system (PCB, thin film display, polymer substrate, etc.) can be processed all in one step, thereby eliminating a separate underfill bonding step normally needed to fix larger components in place.

The previous description is provided to enable a person of ordinary skill in the art to practice the various aspects described herein. While the foregoing has described what are considered to be the best mode and/or other examples, it is understood that various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the terms "a set" and "some" refer to one or more. Pronouns in the masculine (e.g., his) include the feminine and neuter gender (e.g., her and its) and vice versa. Headings and subheadings, if any, are used for convenience only and do not limit the invention.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. A phrase such an embodiment may refer to one or more embodiments and vice versa.

The word "exemplary" is used herein to mean "serving as an example or illustration." Any aspect or design described herein as "exemplary" is not necessarily to be construed as preferred or advantageous over other aspects or designs.

The term "optical" covers electromagnetic radiation from ultraviolet to infrared, including wavelengths in the range of 10 nanometers to 1 millimeter and includes, but is not limited to, light visible to the human eye, which covers the range of 380-760 nanometers.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," "with" or the like is used in the description or the claims, such term is intended to be inclusive in a manner similar to the term "comprise" as "comprise" is interpreted when employed as a transitional word in a claim.

What is claimed is:

1. A method of forming a conductive element on a substrate, the method comprising:
   applying a first layer comprising a nonconductive adhesive over at least a portion of a surface of a substrate;
   applying a second layer comprising nanoparticles of a conductive metal and a curing agent configured to catalyze curing of the nonconductive adhesive, the second layer being applied over the first layer, wherein the second layer does not include an adhesive while being applied; and
   exposing the first layer and the second layer to a temperature for a duration of time to (1) fuse the nanoparticles of the conductive metal together in at least a portion of the first layer and (2) cure the nonconductive adhesive of the first layer, wherein the fusing is substantially complete before the curing is substantially complete, and wherein the nonconductive adhesive is curable and the nanoparticles are fusable at a temperature below about 200° C.

2. The method of claim 1, wherein a thickness of the second layer is greater than a thickness of the first layer.

3. The method of claim 1, wherein the nonconductive adhesive has an electrical polarity that is greater than an electrical polarity of the nanoparticles of the conductive metal.

4. The method of claim 1, wherein the exposing comprises infiltrating the first layer with the conductive metal.

5. The method of claim 1, wherein the exposing comprises infiltrating the second layer with the nonconductive adhesive.

6. The method of claim 1, further comprising:
   after the exposing, applying a third layer comprising an adhesive over at least a portion of a surface of the second layer; and
   applying a fourth layer comprising nanoparticles of a conductive metal over at least a portion of the third layer.

7. The method of claim 1, wherein the exposing comprises applying a laser to achieve the fusing and the curing.

8. A method of forming a conductive element on a substrate, the method comprising:
   applying a first layer comprising a nonconductive adhesive over at least a portion of a surface of a substrate;
   applying a second layer comprising nanoparticles of a conductive metal and a curing agent configured to catalyze curing of the adhesive, the second layer being applied over the first layer, wherein the second layer does not include an adhesive while being applied; and
   exposing the first layer and the second layer to a temperature for a duration of time to (1) fuse the nanoparticles of the conductive metal together in at least a portion of the first layer and (2) cure the adhesive of the first layer, wherein the fusing is substantially complete before the curing is substantially complete;
   wherein the nanoparticles of the second layer penetrate the adhesive of the first layer within an interface having a depth not exceeding 3 nm.

* * * * *